United States Patent
Lee

(10) Patent No.: US 8,209,460 B2
(45) Date of Patent: Jun. 26, 2012

(54) DUAL MEMORY CHIP PACKAGE OPERABLE TO ACCESS HETEROGENEOUS MEMORY CHIPS

(75) Inventor: Jin-Yub Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1607 days.

(21) Appl. No.: 10/976,384

(22) Filed: Oct. 29, 2004

(65) Prior Publication Data

US 2005/0141318 A1 Jun. 30, 2005

(30) Foreign Application Priority Data

Dec. 29, 2003 (KR) .................. 10-2003-0098803

(51) Int. Cl.
*G06F 12/00* (2006.01)
*G06F 13/00* (2006.01)
*G06F 13/28* (2006.01)
*G11C 5/06* (2006.01)
*G11C 11/34* (2006.01)
*G11C 16/04* (2006.01)

(52) U.S. Cl. ........... 711/101; 711/5; 711/100; 711/103; 711/105; 711/117; 365/63; 365/185.05; 365/185.07

(58) Field of Classification Search ................... 711/101
See application file for complete search history.

(56) References Cited

U.S. PATENT DOCUMENTS

| 5,438,549 | A  | * | 8/1995 | Levy | 365/229 |
| 5,590,073 | A  | * | 12/1996 | Arakawa et al. | 365/185.08 |
| 6,366,487 | B1 | * | 4/2002 | Yeom | 365/52 |
| 6,385,688 | B1 | * | 5/2002 | Mills et al. | 711/103 |
| 6,473,831 | B1 | * | 10/2002 | Schade | 711/115 |
| 2001/0039601 | A1 | * | 11/2001 | Leung et al. | 711/101 |
| 2004/0049629 | A1 | * | 3/2004 | Miura et al. | 711/105 |
| 2005/0027928 | A1 | * | 2/2005 | Avraham et al. | 711/103 |

FOREIGN PATENT DOCUMENTS

| JP | 06-124175 | 5/1994 |
| JP | 2001-357684 | 12/2001 |
| JP | 2003-007963 | 1/2003 |
| JP | 2003-338175 | 11/2003 |

OTHER PUBLICATIONS

English language abstract of Japanese Publication No. 2003-338175.

* cited by examiner

*Primary Examiner* — Sanjiv Shah
*Assistant Examiner* — Marwan Ayash
(74) *Attorney, Agent, or Firm* — Myers Bigel Sibley & Sajovec, P.A.

(57) ABSTRACT

A dual-chip package is disclosed which includes at least two memory chips each of which may contain buffer and flash memories having different address systems from each other. Each memory chip may include a register for storing first and second flag signals each indicative of selections of corresponding memory chips, a comparator circuit for comparing the first and second flag signals in the register with a reference signal to generate a flash access signal and a buffer access signal, and a controller for controlling the buffer memory and the flash memory in response to the flash access signal and the buffer access signal.

20 Claims, 3 Drawing Sheets

DUAL MEMORY CHIP PACKAGE OPERABLE TO ACCESS HETEROGENEOUS MEMORY CHIPS

CROSS-REFERENCE TO RELATED APPLICATIONS

This application claims the priority of Korean Patent Application No. 2003-98803, filed Dec. 29, 2003 in the Korean Intellectual Property Office, the disclosure of which is incorporated herein by reference.

FIELD OF THE INVENTION

The present invention is related to a semiconductor device, and, in particular, to a multi-chip package where a plurality of chips are contained.

BACKGROUND OF THE INVENTION

Semiconductor design and manufacture has many goals, including designing high performance, highly integrated, low cost, miniaturized products. Currently, semiconductor devices are mass produced at 0.18 microns or lower, involving well known levels of integration. However, electronic packaging still concerns higher carrier density, smaller overall volume, etc. for high integration. Indeed, to reduce the overall size and the cost, two or more chips may be packaged together for computers and other devices. This kind of packaging will be mainstream in the future. Multi-chip packaging can be employed to integrate processors and memory chips, or logic chips and memory chips (including DRAMs, flash memories, etc.) in a single package. Thus, the cost and the overall size are reduced.

A technique of putting the same memory chips (e.g. two memory chips) in a single package is disclosed in U.S. Pat. No. 6,366,487 ('487) entitled "PLURALITY OF INTEGRATED CIRCUIT CHIPS", which is herein incorporated by reference. A dual-chip package technique described in the '487 patent includes similar memory chips (dies or devices) to those in single packages, to increase memory capacity. With the dual-chip package technique, memory chips contained in a single package are configured to share external pins (address, control and data pins). In this configuration, the memory chips in a single package are distinguished as a top (or MSB) memory chip and a bottom (or LSB) memory chip, and may use option pads. For example, an option pad of the bottom memory chip is connected to a ground voltage while an option pad of the top memory chip is connected to a power supply voltage. When an externally input address indicates the bottom memory chip (or when an MSB address bit of the input address is identical to a value of the option pad of the bottom memory chip), it is capable of accessing the bottom memory chip by means of the input address. When an externally input address indicates the top memory chip (or when an MSB address bit of the input address is identical to a value of the option pad of the top memory chip), it is capable of accessing the top memory chip by means of the input address.

If single packages include multiple memories (e.g. RAM and flash memory) with different address systems, an option pad as above may not distinguish between them, for example, a RAM and a flash memory of each memory chip. That is, it is capable of distinguishing the bottom and top memory chips by the option pad, but it is impossible to select either one of the RAM and the flash memory in the selected memory chip.

Accordingly, in the case that each memory chip contained in a single package includes two memories (e.g. RAM and flash memory) whose address systems are different from each other, a technique is required to access memories, especially memories in different chips.

SUMMARY OF THE INVENTION

An embodiment of the invention provides a dual-chip package capable of accessing memories having different address systems.

In accordance with an embodiment of the present invention, a dual-chip package is provided which includes a plurality of pins, and bottom and top memory chips configured to share the plurality of pins. Furthermore, each of the memory chips may include a buffer memory (e.g. SRAM), a flash memory (e.g. NAND-type flash memory), an option pad connected to either one of a first voltage and a second voltage, a register to indicate a corresponding memory chip and buffer memory, a comparator circuit for comparing the first and second flag signals in the register with a value of the option pad to generate a flash access signal and a buffer access signal, and a controller for controlling the buffer memory and the flash memory.

In the present embodiment, the option pad of the bottom memory chip is connected to a ground voltage as the first voltage and the option pad of the top memory chip is connected to a power supply voltage as the second voltage.

In this embodiment, the first flag signal is programmed in the registers of the bottom and top memory chips before a flash memory access in the memory chips.

In this embodiment, the second flag signal is programmed in the registers of the bottom and top memory chips before a buffer memory access in the bottom and top memory chips.

In this embodiment, an address of the buffer memory, an address of the flash memory and a write/read command are programmed in the registers of the bottom and top memory chips before an access operation to each of the bottom and top memory chips.

In the present embodiment, in response to a flash access signal of the bottom memory chip, the controller of the top memory chip is inactivated, disabling accesses to the flash memory of the top memory chip, while the controller of the bottom memory chip is activated such that a flash memory access of the bottom memory chip is carried out.

In this embodiment, in response to a buffer access signal of the bottom memory chip, the controller of the top memory chip is inactivated, disabling accesses to the buffer memory of the top memory chip, while the controller of the bottom memory chip is activated such that a buffer memory access of the bottom memory chip is carried out.

In this embodiment, in response to a flash access signal of the top memory chip, the controller of the bottom memory chip is inactivated, disabling accesses to the flash memory of the bottom memory chip, while the controller of the top memory chip is activated such that a flash memory access of the top memory chip is carried out.

In this embodiment, in response to a buffer access signal of the top memory chip, the controller of the bottom memory chip is inactivated, disabling accesses to the buffer memory of the bottom memory chip, while the controller of the top memory chip is activated such that a buffer memory access of the top memory chip is carried out.

BRIEF DESCRIPTION OF THE DRAWINGS

A more complete appreciation of the present invention, and many of the attendant advantages thereof, will become readily apparent with reference to the following detailed description and accompanying drawings. Like reference symbols indicate the same or similar components.

DESCRIPTION OF THE PREFERRED EMBODIMENT

Preferred embodiments of the invention will be more fully described with reference to the attached drawings.

Figure 1:
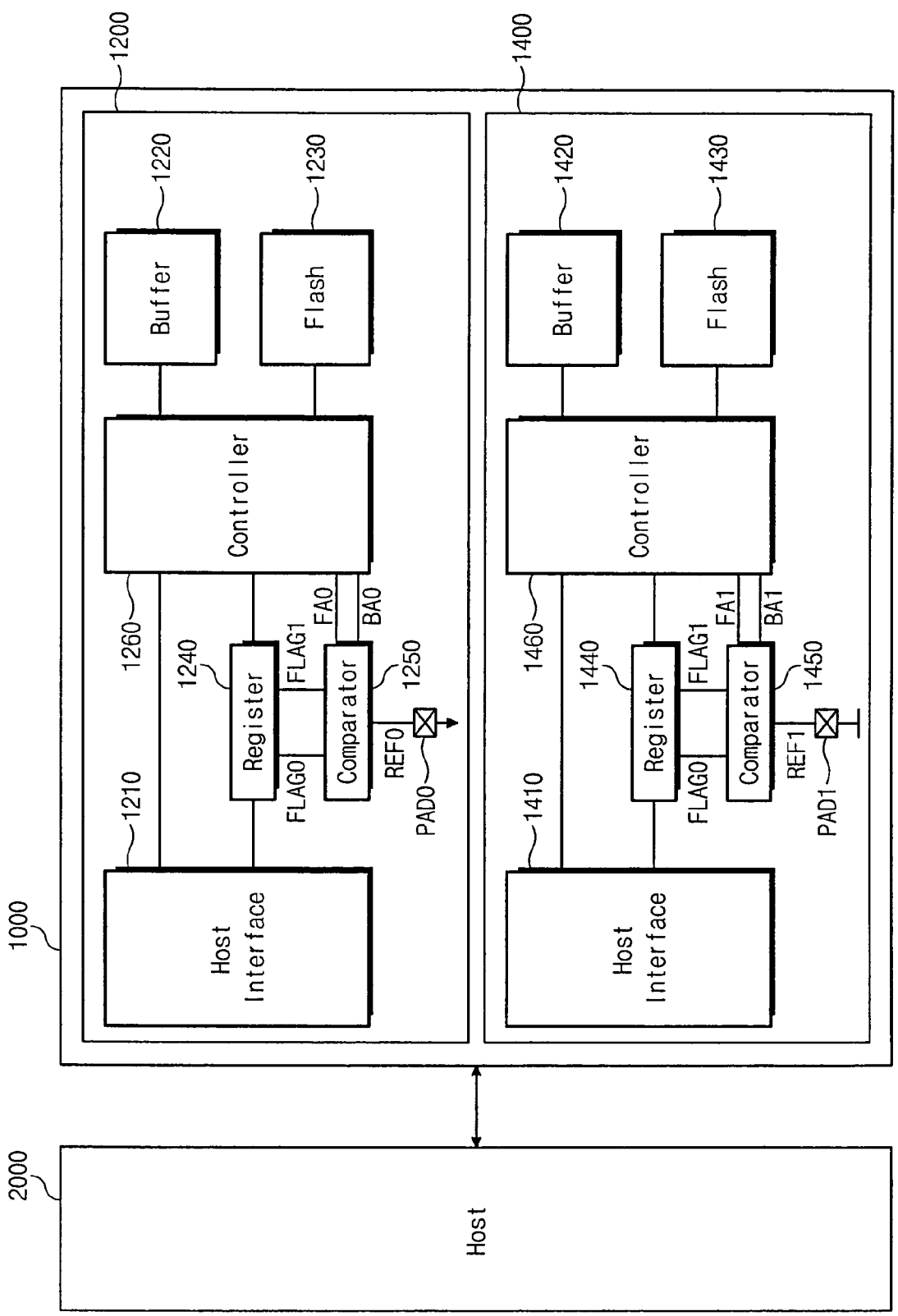
FIG. 1 is a schematic block diagram of a dual-chip package.

A schematic block diagram of a dual-chip package is shown in FIG. 1. Generally, embodiments may provide a method and apparatus to operate a dual-chip package, or a multichip package, where the package has at least 2 types of memory with incompatible address schemes.

Referring to FIG. 1, an embodiment dual-chip package 1000 comprises two memory chips 1200 and 1400. The dual-chip package 1000 stores data from a host 2000, or outputs data requested by the host 2000. The memory chips 1200 and 1400 of dual-chip package 1000 may have the same configuration. The dual-chip package 1000, although not shown in figures, comprises a number of pins (e.g. control, address and data pins) electrically connected to host 2000. The pins of the dual-chip package 1000 are shared by the memory chips 1200 and 1400. That is, when control signals (address and/or data) are supplied to the dual-chip package 1000 from the host 2000, the control signals (address and/or data) to the dual-chip package 1000 are simultaneously supplied to memory chips 1200 and 1400.

In the dual-chip package 1000 according to the present embodiment, the memory chip 1200 is called a bottom memory chip or an LSB chip and the memory chip 1400 may be called a top memory chip or an MSB chip. Memory chip 1200 may be the top memory chip and memory chip 1400 the bottom memory chip. The bottom memory chip 1200 may comprise a host interface 1210, a buffer memory 1220, a flash memory 1230, a register 1240, a comparator 1250, and a controller 1260. The host interface 1210 interfaces with the host 2000 and may have one of various interfaces. For example, the host interface 1210 may have an SRAM interface. Alternatively, the host interface 1210 may have a NOR-type flash memory interface.

To store data in the flash memory 1230, the host 2000 sends the data to the dual-chip package 1000. In an embodiment, a selected one of the memory chips in the dual-chip package 1000 stores the data sent from the host 2000 in the buffer memory 1220. Selection of memory chips 1200 and 1400 will be more fully described below. For example, if memory chip 1200 is selected, the controller 1260 may direct data to be read from the buffer memory 1220, and the read data is stored in the flash memory 1230.

In order to send data stored in the flash memory 1230 to the host 2000, data is read from the flash memory 1230 and stored in buffer memory 1220. Data is read from the buffer memory 1220 according to a request of the host 2000, and sent to the host 2000. The above operations may be carried out under the control of the controller 1260. A data read/write operation of the flash memory 1230 using the buffer memory 1220 improves the host 2000 performance.

In this embodiment, the buffer memory 1220 may be, for example, an SRAM or other type of memory, for example, a random access memory. The host interface 1210 can be determined according to buffer memory 1220 interface.

Referring to FIG. 1, the register 1240 may store a first flag signal FLAG0 indicating whether the bottom memory chip 1200 is selected. For example, the first flag signal FLAG0, asserted low, may be stored in the register 1240 to select the bottom memory chip 1200. In this case, when a read/write command of a flash memory is received from the host 2000, the flash memory 1230 of the bottom memory chip 1200 is accessed. If the first flag signal FLAG0 is asserted high in the register 1240, the flash memory 1230 of the bottom memory chip 1200 is not accessed, although a read/write command of a flash memory may be received from the host 2000. Furthermore, the register 1240 can store a second flag signal FLAG1 indicating selection of the buffer memory 1220 of the bottom memory chip 1200. The second flag signal FLAG1 of a low level may be stored in the register 1240 to select the buffer memory 1220 of the bottom memory chip 1200. In this case, when a read/write command of a buffer memory is received from the host 2000, the buffer memory 1220 of the bottom memory chip 1200 is accessed. If the second flag signal FLAG1 is asserted high and stored in the register 1240, the buffer memory 1220 of the bottom memory chip 1200 is not accessed though a read/write command of a buffer memory is received from the host 2000.

In an embodiment, the register 1240 is used to store addresses and/or data transferred from the host 2000 through the host interface 1210. For example, the register 1240 may store a buffer address of the buffer memory 1220, a flash address of the flash memory 1230, a read/write command of the flash memory, etc.

Referring to embodiments depicted in FIG. 1, the comparator 1250 may compare each of the first and second flag signals FLAG0 and FLAG1 in the register 1240 with a reference signal REF0. For example, the comparator 1250 can activate a flash access signal FA0 when the first flag signal FLAG0 has the same value as the reference signal REF0. The comparator 1250 may activate a buffer access signal BA0 when the second flag signal FLAG1 has the same value as the reference signal REF0. The reference signal REF0 may be determined by a value of an option pad PAD0, for example, if the option pad PAD0 of the bottom memory chip 1200 is grounded. The controller 1260 controls access operations of the buffer memory 1220 and the flash memory 1230 in response to output signals FA0 and BA0 of the comparator 1250. For example, when the flash access signal FA0 is activated, the controller 1260 controls the buffer and flash memories 1220 and 1230 so that data in the buffer memory 1220 is stored in the flash memory 1230 or data in the flash memory 1230 is stored in the buffer memory 1220. When the buffer access signal BA0 is activated, the buffer memory 1220 may be accessed by the host 2000.

In an embodiment, the top memory chip 1400 includes a host interface 1410, a buffer memory 1420, a flash memory 1430, a register 1440, a comparator 1450, and a controller 1460. The constituent elements 1410, 1420, 1430 and 1460 may operate similar to those in memory chip 1200.

In an embodiment memory chip 1400, the register 1440 is used to store a first flag signal FLAG0 indicating selection of the top memory chip 1400. For example, the first flag signal FLAG0, asserted high, may be stored in the register 1440 to select the top memory chip 1400. In this case, when a read/write command of a flash memory is received from the host 2000, the flash memory 1430 of the top memory chip 1400 is accessed. If the first flag signal FLAG0 is asserted low in the register 1440, the flash memory 1430 of the top memory chip 1400 is not accessed, although a read/write command of a flash memory is received from the host 2000. Furthermore, the register 1240 may be used to store a second flag signal FLAG1 indicating whether the buffer memory 1420 of the top memory chip 1400 is selected. For example, the second flag signal FLAG1 may be asserted high in the register 1440 to select the buffer memory 1420 of the memory chip 1400. In this case, when a read/write command of a buffer memory is received from the host 2000, the buffer memory 1420 of memory chip 1400 is accessed. If the second flag signal FLAG1 is asserted low in the register 1240, the buffer memory 1420 of memory chip 1400 is not accessed although a read/write command of a buffer memory is received from the host 2000.

The register 1440 may be used to store addresses and data transferred from the host 2000 through the host interface 1410. For example, the register 1440 may store a buffer address of the buffer memory 1420, a flash address of the flash memory 1430, a read/write command of the flash memory, etc.

Referring to FIG. 1, the comparator 1450 may compare each of the first and second flag signals FLAG0 and FLAG1 in the register 1440 with a reference signal REF 1. For example, the comparator 1450 can activate a flash access signal FA1 when the first flag signal FLAG0 has the same value as the reference signal REF1. The comparator 1450 may activate a buffer access signal BA1 when the second flag signal FLAG1 has the same value as the reference signal REF1. Herein, the reference signal REF1 may be determined by a value of an option pad PAD1, and the option pad PAD1 of the memory chip 1400 can therefore connect to a power supply voltage.

In the bottom and top memory chips 1200 and 1400, the first flag signal is provided to the host 2000 and can be programmed before accessing the flash memory 1230/1430. For example, a value of the first flag signal can be programmed in the registers 1240 and 1440 in case of storing data in a flash memory in either one of the bottom and top memory chips 1200 and 1400 and reading data therefrom. In this case, the second flag signal is not programmed in the registers 1240 and 1440. Alternatively, a value of the second flag signal can be programmed in the registers 1240 and 1440 for accessing a buffer memory 1220/1420.

Figure 2:
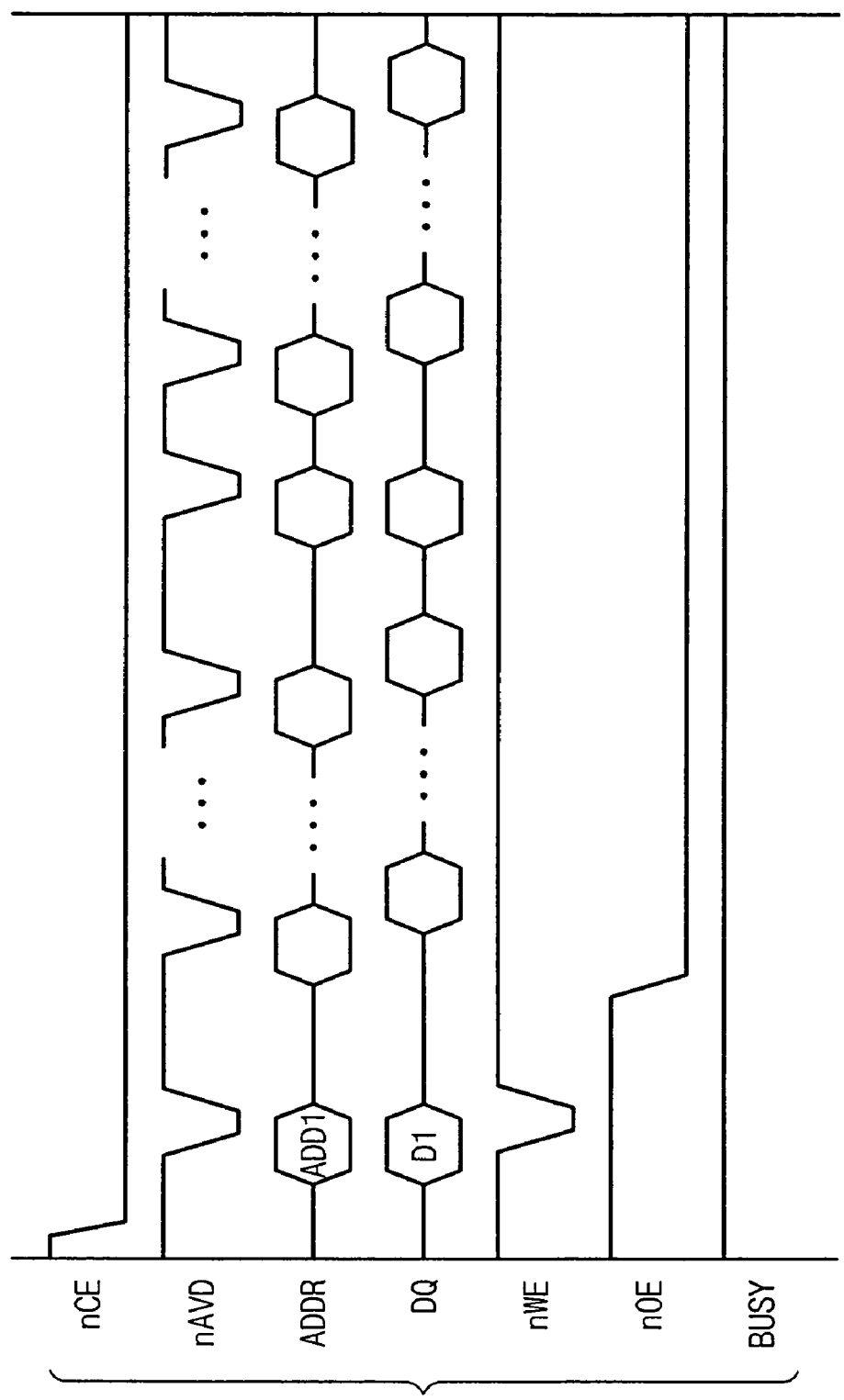
FIG. 2 is a timing diagram for describing an operation of setting registers in bottom and top memory chips when writing/reading data in/from a buffer memory of a dual-chip package.

FIG. 2 is a timing diagram for describing an operation of setting registers in bottom and top memory chips when writing/reading data in/from a buffer memory of a dual-chip package according to the present invention.

In case of randomly reading data from the buffer memory 1220 of the bottom memory chip 1200, the host 2000 may activate a chip enable signal nCE low. Afterwards, as illustrated in FIG. 2, a value D1 of the second flash signal FLAG1 with an address ADD1 is supplied to the dual-chip package 1000 in synchronization with an nWE signal. The address ADD1 appoints regions of the registers 1250 and 1450 where the value D1 of the second flag signal FLAG1 can be stored. In other words, the value D1 of the second flag signal FLAG1 is stored in the regions of the registers 1240 and 1440 corresponding to the address ADD1. For example, if the value D1 is asserted low, the buffer memory 1220 of the bottom memory chip 1200 is accessed while an access operation to the buffer memory 1420 of the top memory chip 1400 is cut off. Therefore, the comparator 1250 of the bottom memory chip 1200 compares the second flag signal FLAG1 with the reference signal REF0 to activate the buffer access signal BA0. This enables the controller 1260 of the bottom memory chip 1200 to operate normally. Contrary, the comparator 1450 of the top memory chip 1400 compares the second flag signal FLAG1 with the reference signal REF1 to inactivate the buffer access signal BA1. This disables the controller 1460 of the top memory chip 1400.

Afterwards, the host 2000 may output a set of addresses to the dual-chip package 1000 according to a given timing. In the bottom memory chip 1200 of the dual-chip package 1000, the controller 1260 controls the buffer memory 1220 so that data is read out from the buffer memory 1220 according to the input addresses and then outputted to the host 2000.

In case of storing data in the buffer memory 1220 of the bottom memory chip 1200, the host 2000 may activate a chip enable signal nCE low. Therefore, a value D1 of the second flash signal FLAG1 with an address ADD1 is supplied to the dual-chip package 1000 in synchronization with an nWE signal. If the value D1 is asserted low, the buffer memory 1220 of the bottom memory chip 1200 can be accessed while an access operation to the buffer memory 1420 of the top memory chip 1400 is cut off. The host 2000 may then output addresses and data to the dual-chip package 1000 according to a given timing. In the bottom memory chip 1200 of the dual-chip package 1000, the controller 1260 may control the buffer memory 1220 so that data from the host 2000 can be stored in any region of the buffer memory 1220 corresponding to the received addresses.

An access operation to the buffer memory 1420 of the top memory chip 1400 may be similar to that described above.

Figure 3:
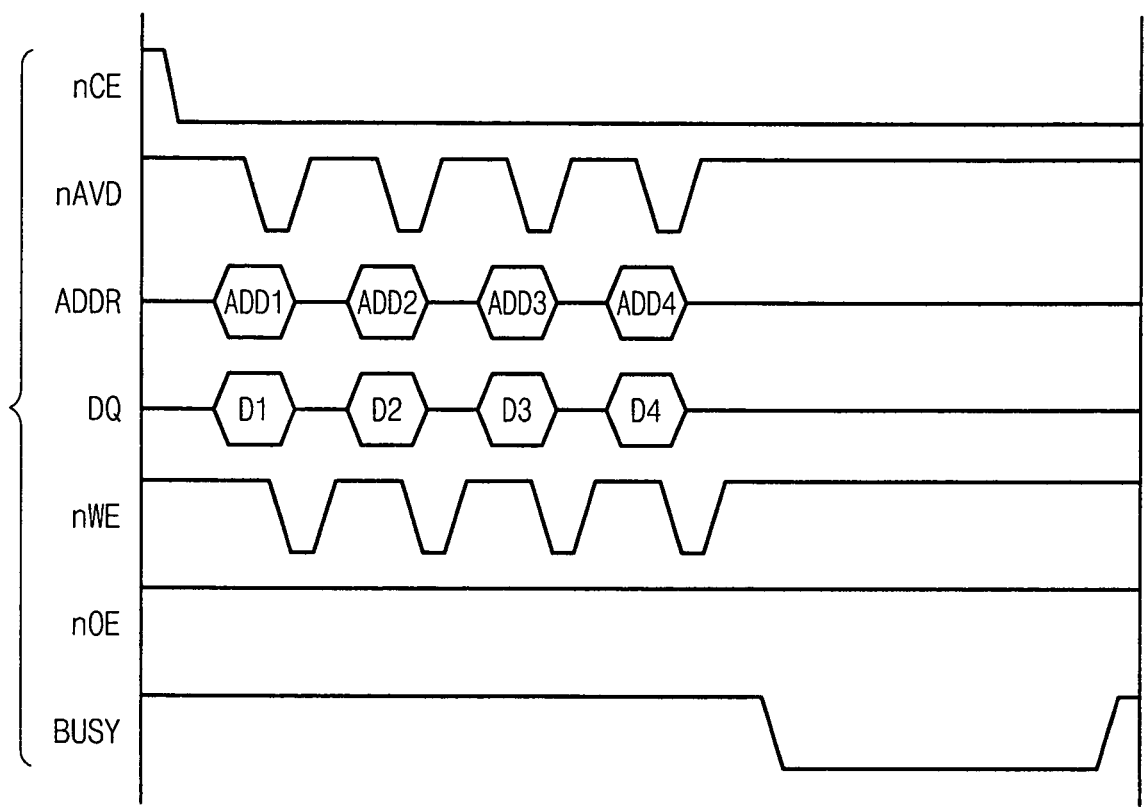
FIG. 3 is a timing diagram for describing an operation of setting registers in bottom and top memory chips when writing data in a flash memory of a dual-chip package.

FIG. 3 is a timing diagram for describing an operation of setting registers in bottom and top memory chips when writing data in a flash memory of a dual-chip package according to an embodiment. In order to store data in a flash memory, data to be stored in a flash memory may be transferred to a buffer memory. A set of operations (that is, register setting and data loading operations) for storing data in the buffer memory can be the same as those described above. After data is transferred to a buffer memory (e.g. a buffer memory of the bottom memory chip), the first flag signal, a buffer address, a flash address, and a write command are programmed in the registers 1250 and 1450 of the bottom and top memory chips 1200 and 1400.

In an embodiment illustrated in FIG. 3, after the chip enable signal nCE is activated low, a value D1 of the first flag signal with a register address ADD1 is outputted to the dual-chip package 1000 from the host 2000 in synchronization with the nWE signal. The register address ADD1 may appoint regions of the registers 1250 and 1450 to store the value D1. Therefore, the value D1 can be stored in the regions of the registers 1250 and 1450 corresponding to the register address ADD1. A register address ADD2 with a buffer address D2 is output to the dual-chip package 1000 from the host 2000 in synchronization with the nWE signal, and the buffer address D2 can be stored in the regions of the registers 1250 and 1450 corresponding to the register address ADD2. The host 2000 may output register address ADD3 with a flash address D3 to the dual-chip package 1000 in synchronization with the nWE signal, and the flash address D3 stored in the regions of the registers 1250 and 1450 corresponding to the register address ADD3. The host may output a register address ADD4 with a write command D4 to the dual-chip package 1000 in synchronization with the nWE signal.

Assume that the first flag signal of a low level is stored in each of the registers 1250 and 1450. Since the first flag signal of the low level is stored in the register 1250, as described above, the bottom memory chip 1200 may operate while the top memory chip 1400 does not. Therefore, the comparator 1250 of the bottom memory chip 1200 can compare the first flag signal FLAG0 and the reference signal REF0 to activate the flash access signal FA0. This enables the controller 1260 of the bottom memory chip 1200 to operate normally. Alternatively, the comparator 1450 of the bottom memory chip 1400 may compare the first flag signal FLAG0 and the reference signal REF1 to inactivate the flash access signal FA1. This would disable the controller 1460 of the top memory chip 1400.

In an embodiment memory chip 1200, the controller 1260 responds to the write command in the register 1250 and controls the buffer and flash memories 1220 and 1230 so that data in the buffer memory 1220 is stored in the flash memory 1230. For example, the controller 1260 may read out data from the buffer memory 1220 and store the read-out data in the flash memory 1230. A read operation of the buffer memory (e.g. SRAM) and a program operation of the flash memory (e.g. NAND-type flash memory) are well known.

In an embodiment, in order to read out data from a flash memory, the first flag signal, a buffer address, a flash address, and a read command are programmed in the registers 1250 and 1450 of the bottom and top memory chips 1200 and 1400.

After the chip enable signal nCE is activated low, the registers 1240 and 1440 are set in the same manner as described above. That is, the first flag signal, a buffer address, a flash address, and a read command are programmed in the registers 1250 and 1450. If the first flag signal having a high level is stored in the registers 1250 and 1450, the bottom memory chip 1200 does not operate while the top memory chip 1400 operates.

In the top memory chip 1400, the controller 1460 may control a read operation of the flash memory 1430 in response to the read command in the register 1450. For example, a read command and addresses may be sequential input to the flash memory 1430. The flash memory 1430 can therefore output data, and the controller 1460 may control the buffer memory 1420 so that data from the flash memory 1430 is stored in a region of the buffer memory 1420 corresponding to the buffer address in the register 1450. If the data from the flash memory 1430 is stored in the buffer memory 1420, the host 2000 fetches data in the buffer memory 1420. Before data in the buffer memory 1420 is transferred to the host 2000, the registers 1240 and 1440 are reset under the control of the host 2000. That is, the second flag signal of a high level is programmed in the registers 1240 and 1440. Afterwards, the host 2000 may output a set of addresses to the dual-chip package 1000 according to the given timing. In the top memory chip 1400, the controller 1460 reads out data from the buffer memory 1420 in response to the input addresses and outputs the read-out data to the host 2000.

As describe above, in case of memory chips each of which includes memories (e.g. buffer and flash memories) having different address systems from each other, it is possible to freely access the buffer and flash memories of each memory chip by setting registers in the memory chips before accessing each memory chip.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A multi-chip package comprising:
   a plurality of pins;
   a bottom and top memory chip coupled with the plurality of pins, each memory chip including at least two memories with different address schemes, and each memory chip including an option pad; and
   circuitry to access one of the memories based on the respective signals present on the option pads, the circuitry including:
   a register to store a first flag signal indicative of selection of a corresponding memory chip and a second flag signal indicative of selection of a buffer memory,
   a comparator circuit to compare the first and second flag signals with a value of the option pad to generate a flash access signal and a buffer access signal, and
   a controller to control a buffer memory and a flash memory in response to the flash access signal and the buffer access signal.

2. The multi-chip package of claim 1, wherein the option pad of the bottom memory chip is connected to a first voltage and the option pad of the top memory chip is connected to a second voltage.

3. The multi-chip package of claim 1, wherein the first flag signal is programmed in registers of the bottom and top memory chips before an access to the flash memory in the respective bottom and top memory chips.

4. The multi-chip package of claim 3, wherein the second flag signal is programmed in the registers of the bottom and top memory chips before an access to the buffer memory in the respective bottom and top memory chips.

5. The multi-chip package of claim 4, wherein an address of the buffer memory, an address of the flash memory and a write/read command are programmed in the registers of the bottom and top memory chips before an access to each of the bottom and top memory chips.

6. The multi-chip package of claim 1, wherein the buffer memory is an SRAM and the flash memory is a NAND-type flash memory.

7. The multi-chip package of claim 1, wherein when the flash access signal of the bottom memory chip is activated, the controller of the top memory chip is inactivated to disable accesses to the flash memory of the top memory chip, while the controller of the bottom memory chip is activated to allow accesses to the flash memory of the bottom memory chip.

8. The multi-chip package of claim 1, wherein when the buffer access signal of the bottom memory chip is activated, the controller of the top memory chip is inactivated to disable accesses to the buffer memory of the top memory chip, while the controller of the bottom memory chip is activated to allow accesses to the buffer memory of the bottom memory chip.

9. The multi-chip package of claim 1, wherein when the flash access signal of the top memory chip is activated, the controller of the bottom memory chip is inactivated to disable accesses to the flash memory of the bottom memory chip, while the controller of the top memory chip is activated to allow accesses to the flash memory of the top memory chip.

10. The multi-chip package of claim 1, wherein when the buffer access signal of the top memory chip is activated, the controller of the bottom memory chip is inactivated to disable accesses to the buffer memory of the bottom memory chip, while the controller of the top memory chip is activated to allow accesses to the buffer memory of the top memory chip.

11. A multi-chip package comprising:
    a plurality of pins;
    a bottom and top memory chip coupled with the plurality of pins, each memory chip including at least two memories with different address schemes, and each memory chip including an option pad;
    circuitry to access one of the memories based on a signal on an option pad, the circuitry including a register to store a first flag signal indicative of selection of a corresponding memory chip and a second flag signal indicative of selection of a buffer memory;

a comparator circuit to compare the first and second flag signals with a value of the option pad to generate a flash access signal and a buffer access signal; and a controller to control a buffer memory and a flash memory in response to the flash access signal and the buffer access signal.

12. A semiconductor package comprising:

a first semiconductor chip including:
   a buffer memory,
   a flash memory having a different address scheme than the buffer memory,
   an option pad connected to a ground voltage,
   a register to store a first flag signal indicative of selection of a corresponding memory chip and a second flag signal indicative of selection of a buffer memory,
   a comparator circuit to compare the first and second flag signals with a value of the option pad to generate a flash access signal and a buffer access signal, and
   a controller for controlling the buffer memory and the flash memory; and a second semiconductor chip including:
   a buffer memory,
   a flash memory having a different address scheme than the buffer memory,
   an option pad connected to a power supply voltage,
   a register to store a first flag signal indicative of selection of a corresponding memory chip and a second flag signal indicative of selection of a buffer memory,
   a comparator circuit to compare the first and second flag signals with a value of the option pad to generate a flash access signal and a buffer access signal, and
   a controller for controlling the buffer memory and the flash memory.

13. The semiconductor package of claim 12, wherein the first and second flag signals of the first and second semiconductor chips are programmed before a buffer memory access or a flash memory access is performed on the first or second semiconductor chip.

14. A method of accessing a particular memory in the semiconductor package of claim 12, wherein in response to a flash access signal of the second semiconductor chip, the controller of the first semiconductor chip is inactivated, disabling access to the flash memory of the first semiconductor chip, while the controller of the second semiconductor chip is activated such that a flash memory access of the second semiconductor chip is carried out.

15. A method of accessing a particular memory in the semiconductor package of claim 12, wherein in response to a buffer access signal of the second semiconductor chip, the controller of the first semiconductor chip is inactivated, disabling access to the buffer memory of the first semiconductor chip, while the controller of the second semiconductor chip is activated such that a buffer memory access of the second semiconductor chip is carried out.

16. A method of accessing a particular memory in the semiconductor package of claim 12, wherein in response to a flash access signal of the first semiconductor chip, the controller of the second semiconductor chip is inactivated, disabling accesses to the flash memory of the second semiconductor chip, while the controller of the first semiconductor chip is activated such that a flash memory access of the first semiconductor chip is carried out.

17. A method of accessing a particular memory in the semiconductor package of claim 12, wherein in response to a buffer access signal of the first semiconductor chip, the controller of the second semiconductor chip is inactivated, disabling accesses to the buffer memory of the second semiconductor chip, while the controller of the first semiconductor chip is activated such that a buffer memory access of the first semiconductor chip is carried out.

18. The semiconductor package of claim 12, wherein the buffer memories of the first and second semiconductor chips are SRAM memories.

19. The semiconductor package of claim 12, wherein the buffer memories of the first and second semiconductor chips are configured to store data from the flash memories of the first and second semiconductor chips when data is read from the corresponding flash memory to a host connected to the semiconductor package.

20. The semiconductor package of claim 12, wherein the buffer memories of the first and second semiconductor chips are configured to store data from a host connected to the semiconductor package to the flash memories of the first and second semiconductor chips when data is written from the host to the corresponding flash memory.

* * * * *